(12) United States Patent
Ellis-Monaghan et al.

(10) Patent No.: US 10,511,143 B2
(45) Date of Patent: Dec. 17, 2019

(54) III-V LASERS WITH ON-CHIP INTEGRATION

(71) Applicant: GLOBALFOUNDRIES Inc., Grand Cayman (KY)

(72) Inventors: John J. Ellis-Monaghan, Grand Isle, VT (US); Sebastian Ventrone, South Burlington, VT (US); Vibhor Jain, Essex Junction, VT (US); Yves Ngu, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/692,136

(22) Filed: Aug. 31, 2017

(65) Prior Publication Data

US 2019/0067905 A1 Feb. 28, 2019

(51) Int. Cl.
| | |
|---|---|
| H01S 5/00 | (2006.01) |
| H01S 5/062 | (2006.01) |
| H01S 5/022 | (2006.01) |
| H01S 5/026 | (2006.01) |
| H01S 5/183 | (2006.01) |
| H01S 5/223 | (2006.01) |
| H01S 5/22 | (2006.01) |

(52) U.S. Cl.
CPC ........ *H01S 5/06203* (2013.01); *H01S 5/0071* (2013.01); *H01S 5/0264* (2013.01); *H01S 5/0265* (2013.01); *H01S 5/02272* (2013.01); *H01S 5/18369* (2013.01); *H01S 5/2215* (2013.01); *H01S 5/2231* (2013.01)

(58) Field of Classification Search
CPC .. H01S 5/0265; H01S 5/06251; H01S 5/0625; H01S 5/141; H01S 5/142; H01S 5/1071; H01S 5/06203; H01S 5/02272; H01S 5/2231; H01S 5/2215; H01S 5/18369; H01S 5/0264; H01S 5/1003; H01S 5/101
See application file for complete search history.

(56) References Cited

U.S. PATENT DOCUMENTS

| | | |
|---|---|---|
| 6,154,475 A | 11/2000 | Soref et al. |
| 6,556,610 B1 | 4/2003 | Jiang et al. |
| 6,711,195 B2 | 3/2004 | Chang et al. |
| 6,897,471 B1 | 5/2005 | Soref et al. |

(Continued)

OTHER PUBLICATIONS

Tin Komljenovic, et al. "Widely-Tunable Ring ResonatorSemiconductor Laser", Appl. SCI (2017) , pp. 1-21. (Year: 2017).*

(Continued)

*Primary Examiner* — Xinning (Tom) Niu
*Assistant Examiner* — Delma R. Fordé
(74) *Attorney, Agent, or Firm* — Thompson Hine LLP; Anthony Canale (57) ABSTRACT

Structures for integrated lasers, systems including integrated lasers, and associated fabrication methods. A ring waveguide and a seed region are arranged interior of the ring waveguide. A laser strip extends across a portion of the ring waveguide. The laser strip has an end contacting the seed region and another opposing end. The laser strip includes a laser medium and a p-n junction capable of generating electromagnetic radiation. The p-n junction of the laser strip is aligned with a portion of the ring waveguide.

17 Claims, 12 Drawing Sheets

(56) References Cited

U.S. PATENT DOCUMENTS

| | | | | |
|---|---|---|---|---|
| 8,767,792 | B2* | 7/2014 | Bowers | H01S 5/0424 372/43.01 |
| 8,891,577 | B2* | 11/2014 | Xu | H01S 5/1071 372/87 |
| 2004/0032886 | A1* | 2/2004 | Taghavi-Larigani | H01S 5/1032 372/20 |
| 2006/0153268 | A1* | 7/2006 | Yu | G02B 6/12004 372/94 |
| 2012/0002694 | A1* | 1/2012 | Bowers | H01S 5/14 372/45.01 |
| 2012/0320939 | A1* | 12/2012 | Baets | B82Y 20/00 372/45.01 |
| 2013/0016744 | A1* | 1/2013 | Li | H01S 5/1039 372/20 |
| 2015/0024507 | A1* | 1/2015 | Han | G01N 21/7746 436/149 |
| 2016/0094014 | A1* | 3/2016 | Shin | H01S 5/2031 372/45.01 |
| 2017/0040773 | A1* | 2/2017 | Chimot | H01S 5/005 |
| 2017/0098921 | A1* | 4/2017 | Takabayashi | H01S 5/02284 |
| 2017/0207600 | A1* | 7/2017 | Klamkin | H01S 5/02292 |
| 2017/0331249 | A1* | 11/2017 | Liang | H01S 5/026 |
| 2018/0261978 | A1* | 9/2018 | Kurczveil | H01S 5/1092 |

OTHER PUBLICATIONS

Di Liang et al. "High-Index Contrast Ridge Waveguide Lasers Fabricated Via Oxygen-Enhanced Wet Thermal Oxidation", Dept. of Electrical Engineering, Univ. of Notre Dame, pp. 1-12. (Year: 2019).*

A.A. Maznev "Laser generated surface acoustic waves in ring-shaped waveguide resonator", Ultrasonic 49 (2009) pp. 1-3. (Year: 2009).*

Minh A. Tran et al. "Ultra-low loss silicon waveguides for heterogeneously integrated silicon/III-V photonics", Dept. of Electrical and Computer (Year: 2010).*

C. Y. Liu et al. "InGaAs-GaAs 980 nm stripe Geometry and Circular Ring Ridge Waveguide Laser Fabricated with Pulsed Anodic Oxidation", IEEE Photonic Technology Letters, vol. 17, No. 2, Feb. 2015, pp. 273-275. (Year: 2015).*

Chee-Wei Lee et al. "Light extraction—a partial considerationfor a plasmonic nano-ring laser" RSC Publishing, Nanoscale, 2013, 5, pp. 10838-10838 (Year: 2013).*

Aim Bogaerts et al. "Silicon microring resonators" Laser Photonic Rec. 6, No. 1, (2013) pp. 47-73. (Year: 2013).*

Stevan Stankovie et al. "Hybrid III-V/Si Distributed feedbacklaser based on Adhesive bonding" IEEE Photonics technology letters, vol. 24, No. 23, Dec. 1, 2012, pp. 2155-2158. (Year: 2012).*

Min Ren et al. "Hybrid integrated single-wavelength laser withsilicon micro-ring reflector" SPIE OPTO, vol. 10537, 2018, pp. 10537N-1 through 10537N-6. (Year: 2018).*

Littlejohns et al., "Towards a fully functional integrated photonic-electronic platform via a single SiGe growth step", Scientific Reports | 6:19425 | DOI: 10.1038/srep19425, received: Sep. 22, 2015, Published: Jan. 19, 2016.

Ma et al., "Transmission of a 40 GHz optical millimeter wave generated by quadrupling a 10 GHz local oscillator via a Mach—Zehnder modulator", J. Opt. A: Pure Appl. Opt. 11 (2009) (7pp).

Spott et al., "Quantum cascade laser on silicon" Optica, vol. 3, No. 5, May 2016.

Roelkens, et al., "Laser emission and photodetection in an InP/InGaAsP layer integrated on and coupled to a Silicon-on-Insulator waveguide circuit" Optics Express, vol. 14, No. 18, Sep. 4, 2006.

* cited by examiner

III-V LASERS WITH ON-CHIP INTEGRATION

BACKGROUND

The present invention relates to semiconductor device fabrication and integrated circuits and, more specifically, to integrated lasers in semiconductor devices.

Semiconductor ring lasers (SRL) are small ring laser devices that may be formed in integrated circuit structures. Laser light generally may be generated and transferred into a ring waveguide, where the light may reflect internally and build in intensity as it continues to reflect around the ring, and eventually output to an output or passing waveguide. An electrical bias may be applied to a junction in the ring waveguide to amplify the laser light. The laser light output from the ring may then be transmitted via the passing waveguide to other parts of the integrated circuit structure or to other devices. As integrated circuit structure technology continues to advance, applications and uses for semiconductor ring lasers have increased, which in turn increases demand for more advanced semiconductor ring lasers that can be applied to numerous circuit structures and devices.

SUMMARY

In an embodiment of the invention, a structure includes a ring waveguide and a seed region arranged interior of the ring waveguide. A laser strip extends across a portion of the ring waveguide. The laser strip has an end contacting the seed region and another opposing end. The laser strip includes a laser medium and a p-n junction capable of generating electromagnetic radiation. The p-n junction of the laser strip is aligned with a portion of the ring waveguide.

In an embodiment of the invention, a system has a laser generating structure, a voltage source, and a controller. The laser generating structure has a ring waveguide, a passing waveguide adjacent to the ring waveguide, and a laser strip extending across the ring waveguide. The controller is operatively coupled to the voltage source, the laser strip, and the ring waveguide, and is capable of controlling the voltage source to modify a bias applied to the ring waveguide to determine a power of a laser generated by the laser generating structure.

In an embodiment of the invention, a method includes forming a ring waveguide in a semiconductor wafer and forming a seed region interior of the ring waveguide. A laser strip is formed of a semiconductor material, with the laser strip contacting the seed region and extending across the ring waveguide. The laser strip is thermally treated to cause recrystallization of the semiconductor material of the laser strip.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 2A is a top view of the structure in which FIG. 2 is taken generally along line 2-2.

FIG. 9B is a top view in which FIG. 9 is taken generally along line 9-9 and FIG. 9A is taken generally along line 9A-9A.

DETAILED DESCRIPTION

Figure 1:
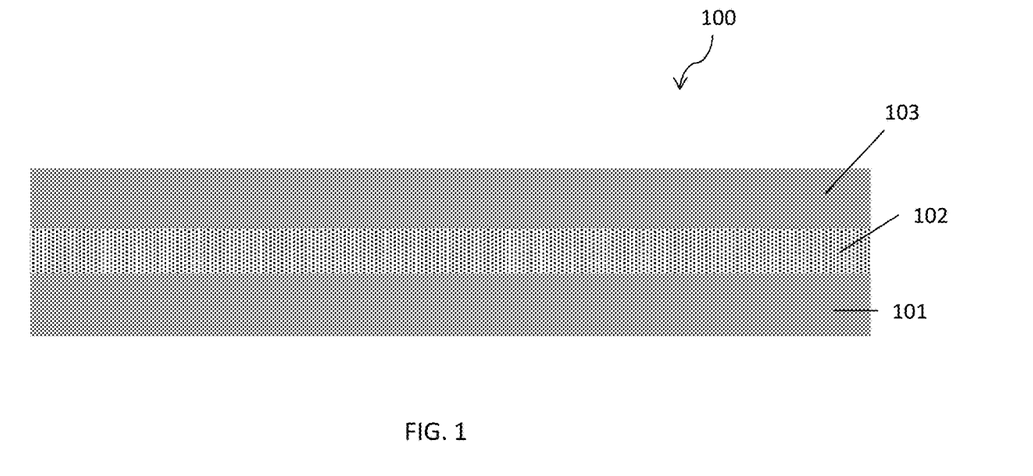
FIGS. 1-8 are cross-sectional views of a structure at successive fabrication stages of a processing method in accordance with embodiments of the invention.

With reference to FIG. 1 and in accordance with embodiments of the invention, a structure 100 is depicted including a semiconductor layer 103 over a buried dielectric layer 102, supported by a substrate 101. Substrate 101 may be, for example, a semiconductor wafer or handle wafer. The buried dielectric layer 102 may be composed of an oxide-based dielectric material (e.g., silicon dioxide), and may be referred to as a buried oxide or BOX layer. Semiconductor layer 103 may be composed of silicon or another semiconductor material.

Figure 2:
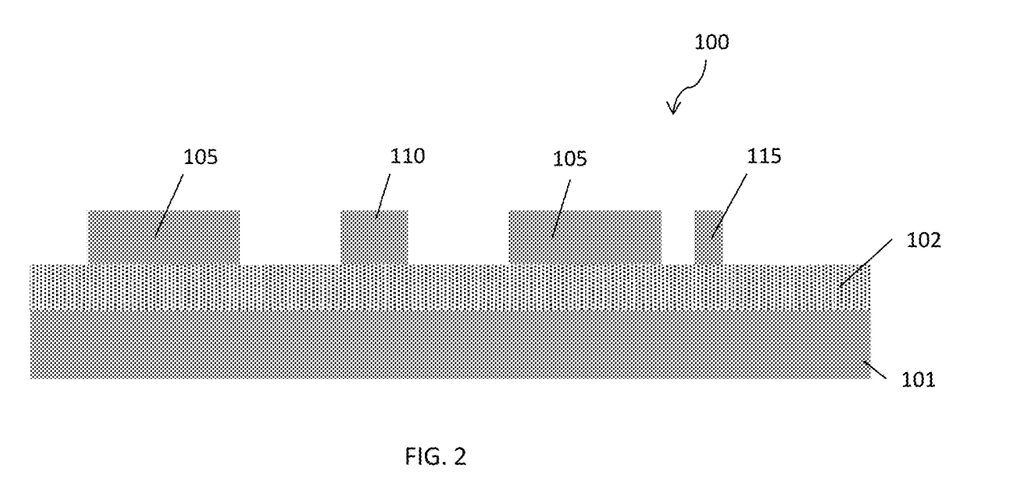
Figure 2A:
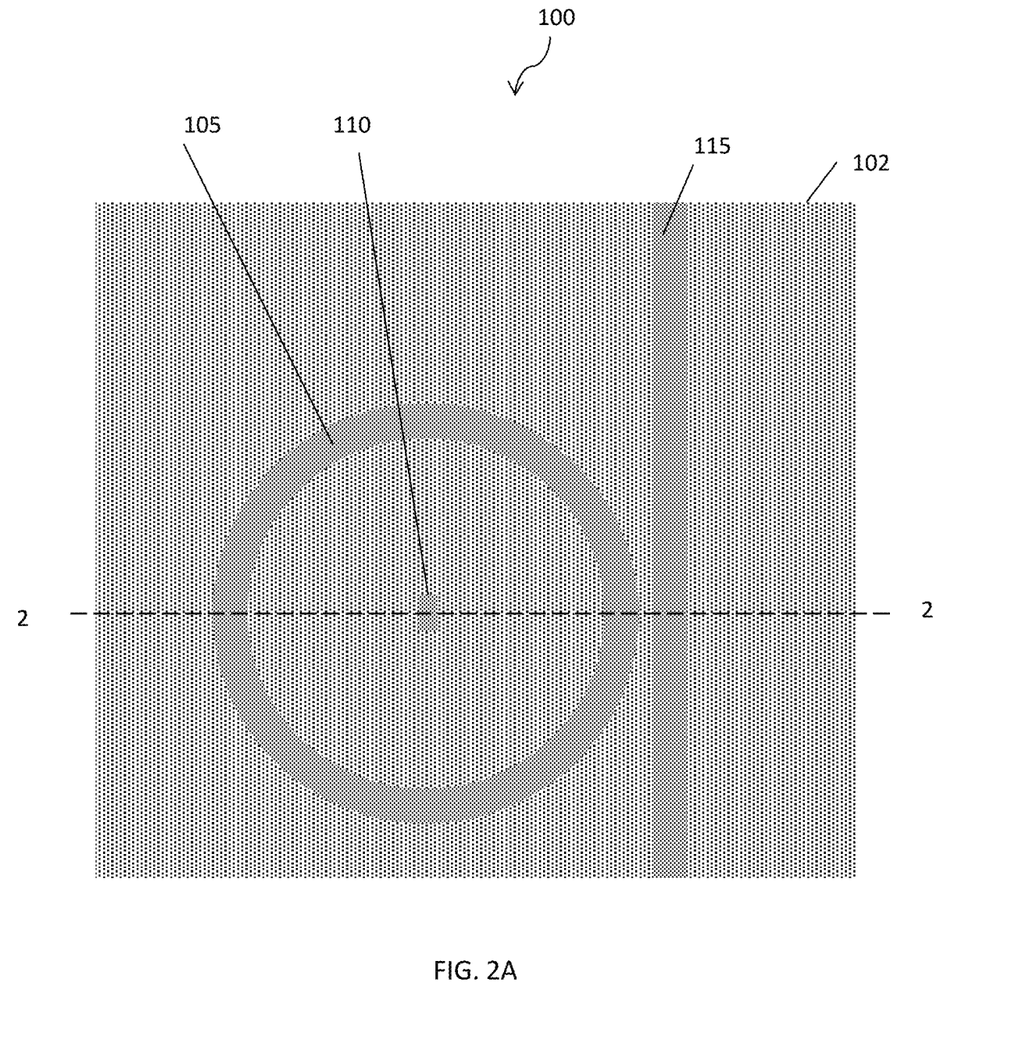

With reference to FIGS. 2 and 2A in which like reference numerals refer to like features in FIG. 1 and at a subsequent fabrication stage of the processing method, semiconductor layer 103 is etched to partially form a ring waveguide 105, a seed region 110, and a passing waveguide 115. FIG. 2 shows a cross-section of structure 100, and FIG. 2A shows a top-down view of structure 100 following etching. For ease of understanding and illustration, FIGS. 2 and 2A are not drawn to the same scale. Etching of semiconductor layer 103 may be carried out, for example, via a photolithographic etch process. Seed region 110 may be formed interior of the ring waveguide 105, and may be formed at or near a center of ring waveguide 105. Seed region 110 may be any desired shape or size. Seed region 110, due to its crystal structure, acts as recrystallization seed for the formation of a laser strip 160 and serves as a dopant source, as described below.

Figure 3:
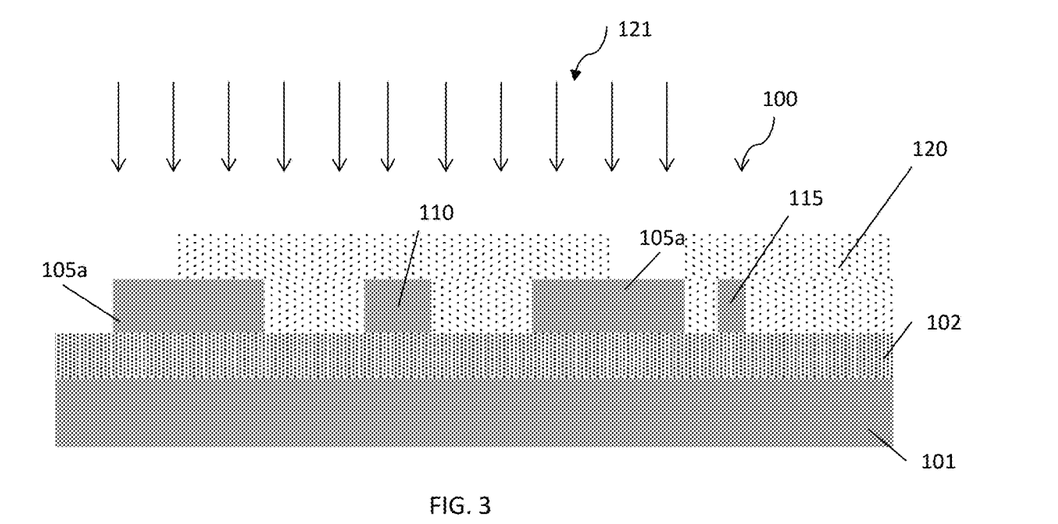
Figure 4:
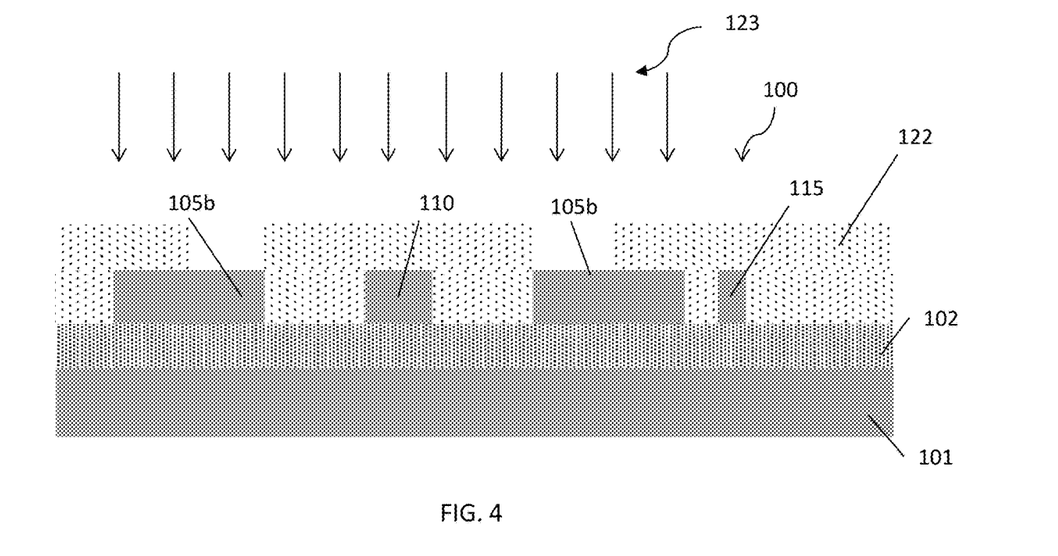

With reference to FIGS. 3 and 4 in which like reference numerals refer to like features in FIGS. 2 and 2A and at a subsequent fabrication stage of the processing method, the ring waveguide 105 undergoes implantation to introduce dopants of opposite polarities and form a p-n junction 106 (FIG. 5) within the ring waveguide 105. In FIG. 3, portions of structure 100 may be masked with a patterned masking layer 120 that leaves portions 105*a* of ring waveguide 105 exposed for implanting ions 121 of a dopant, such as an n-type dopant. In FIG. 4, another patterned masking layer 122 masks portions of structure 100 to leave other portions 105*b* of ring waveguide 105 exposed for implanting ions 123 of another dopant, such as a p-type dopant. It will be understood that implanting ions 121, 123 of dopants into ring waveguide 105 may be done in any order, and that p-type and n-type dopants may be implanted in different portions 105*a*, 105*b*, depending on the particular requirements of the ring waveguide 105. It will also be understood that patterned masking layers 120, 122 may include multiple material layers and may be removed following the implantation of ions 121, 123. The p-type and n-type dopants may be activated and implantation damage may be alleviated by an annealing process following implantation.

The implantation of ions 121, 123 of n-type and p-type dopants into ring waveguide 105 may be controlled with a separate implantation to produce heavily doped n-type and p-type regions at an inner diameter and outer diameter of ring waveguide 105. For example, portions 105a of ring waveguide 105 implanted with ions of an n-type dopant may be heavily doped with the n-type dopant ions at an outer diameter of ring waveguide 105. Similarly, portions 105b of ring waveguide 105 implanted with ions of a p-type dopant may be heavily doped with the p-type dopant ions at an inner diameter of ring waveguide 105. As described below and depicted in FIGS. 5 and 6, shallow trench isolation regions 137 may be formed in ring waveguide 105, and heavily-doped p-type and n-type regions near top surfaces of ring waveguide 105 may provide conductive contacts to the p-type and n-type regions within ring waveguide.

Figure 5:
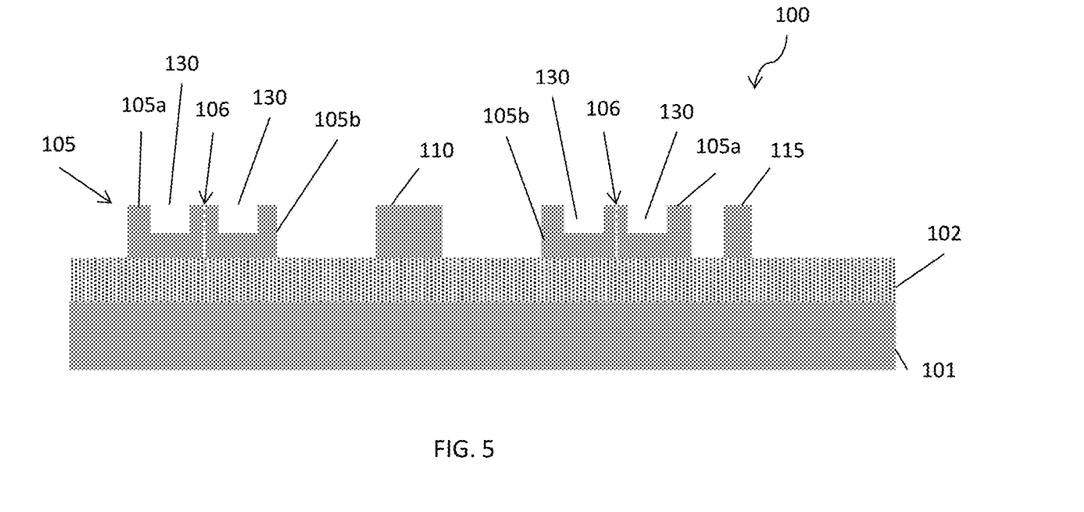

With reference to FIG. 5 in which like reference numerals refer to like features in FIGS. 3 and 4 and at a subsequent fabrication stage of the processing method, a plurality of shallow trenches 130 are etched in ring waveguide 105. Shallow trenches 130 may be formed, for example, by a photolithographic etch process. As further discussed below, shallow trenches 130 may be filled with a dielectric material to form shallow trench isolation regions 137 within ring waveguide 105. As illustrated in FIG. 9B, shallow trenches 130 may be etched as concentric circular trenches in ring waveguide 105. FIG. 5 also depicts the p-n junction 106 formed in ring waveguide 105 as a result of implanting ions 121, 123 as depicted in FIGS. 3,4.

Figure 6:
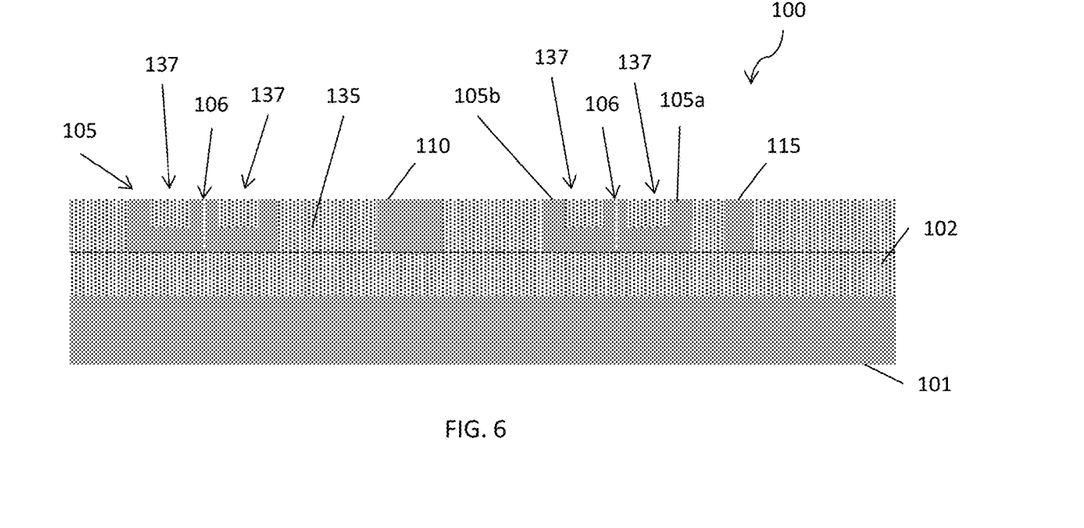

With reference to FIG. 6 in which like reference numerals refer to like features in FIG. 5 and at a subsequent fabrication stage of the processing method, a dielectric material is provided over structure 100, forming shallow trench isolation regions 135 between the ring waveguide 105 and passing waveguide 115 as well as seed region 110, and forming shallow trench isolation regions 137 in shallow trenches 130 within ring waveguide 105 that electrically isolate doped region 105a from doped region 105b except at junction 106. The dielectric may be deposited by any process such as by chemical vapor deposition (CVD), and may be planarized as shown in FIG. 6 by, for example, a chemical mechanical polishing (CMP) process. The dielectric filling shallow trench isolation regions 135, 137 may be, in one example, an oxide-based dielectric material (e.g., silicon dioxide) similar to or identical to buried dielectric layer 102.

In embodiments, the actions described in connection with FIGS. 2-6 may be performed in any order and/or one or more of the actions may be performed concurrently.

Figure 7:
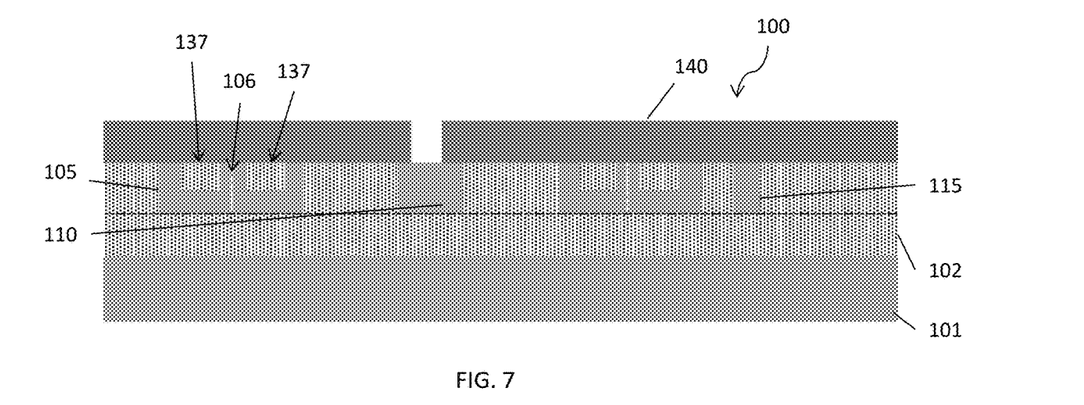

With reference to FIG. 7 in which like reference numerals refer to like features in FIG. 6 and at a subsequent fabrication stage of the processing method, a patterned dielectric layer 140 is formed over structure 100. Patterned dielectric layer 140 is patterned with a masked etching process, for example, to leave at least a portion of seed region 110 exposed while covering ring waveguide 105 and passing waveguide 115. Patterned dielectric layer 140 may be, for example, a nitride-based dielectric material (e.g., silicon nitride).

Figure 8:
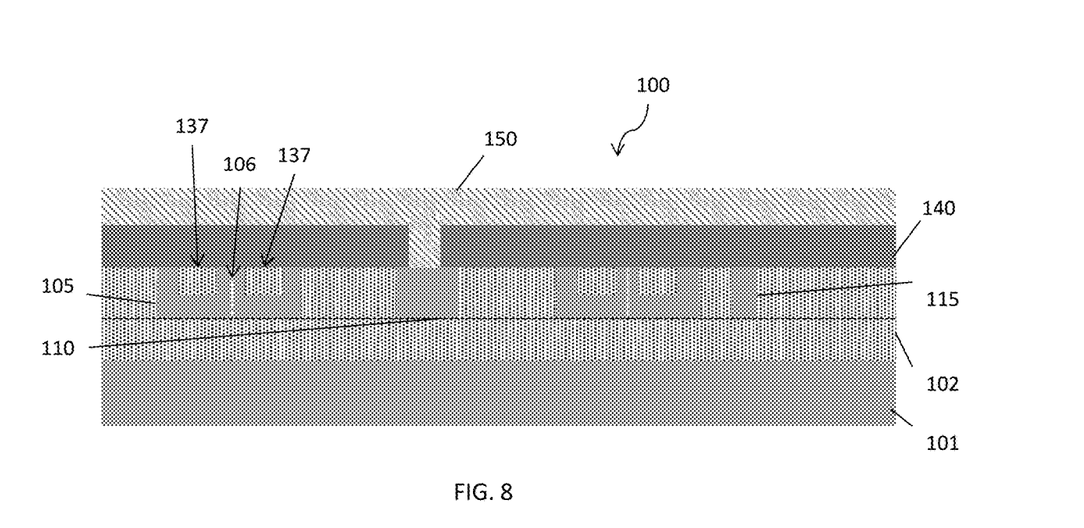

With reference to FIG. 8 in which like reference numerals refer to like features in FIG. 7 and at a subsequent fabrication stage of the processing method, a semiconductor material layer 150 is deposited over patterned dielectric layer 140. A section of the semiconductor material layer 150 contacts seed region 110. Semiconductor material layer 150 may be composed of a ternary III-V semiconductor material, such as gallium arsenide antimonide. In an alternative embodiment, the semiconductor material layer 150 may be composed of a quaternary III-V semiconductor material, such as indium gallium arsenide antimonide. Semiconductor material layer 150 may be provided, for example, by a sputter deposition process, and may be polycrystalline or amorphous in its as-deposited condition. As described further below, semiconductor material layer 150 may be selected so that the semiconductor material of seed region 110 acts as a dopant, such as an n-type or p-type dopant, when diffused into the semiconductor material of semiconductor material layer 150. For example, silicon behaves as an n-type dopant in gallium arsenide antimonide. A layer of gallium arsenide antimonide may be represented by the composition $GaAs_xSb_{1-x}$, where x may be between 1 and 0 and denotes the relative ratio of arsenic to antimony. For example, semiconductor material layer 150 may initially have equal amounts of arsenic and antimony, corresponding to an x value of 0.5 indicating a one-to-one ratio of arsenic to antimony.

Figure 9:
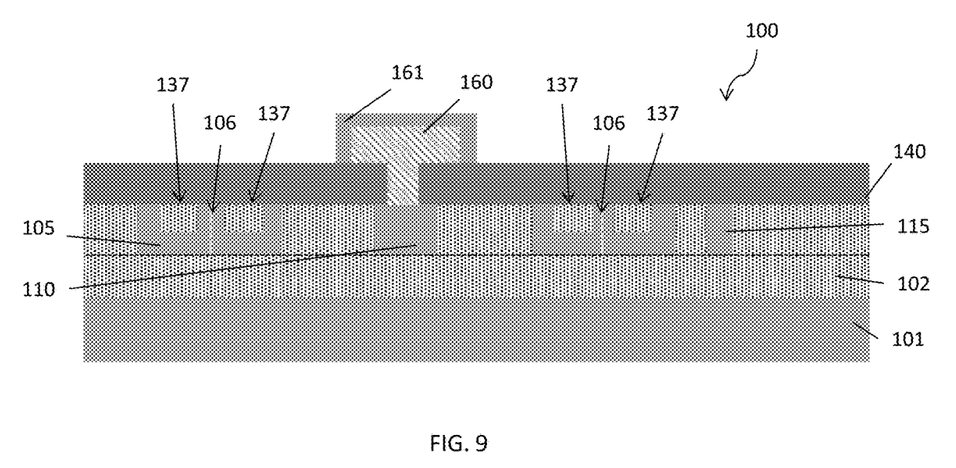
FIG. 9 is a cross-sectional view of the structure at a processing stage subsequent to FIG. 8.
Figure 9A:
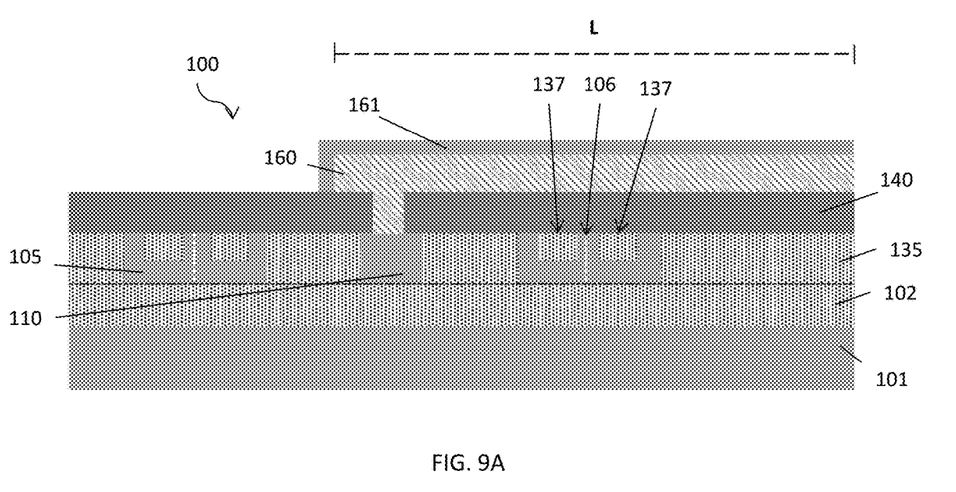
FIG. 9A is a cross-sectional view of the structure taken generally along line 9A-9A in FIG. 9B.
Figure 9B:
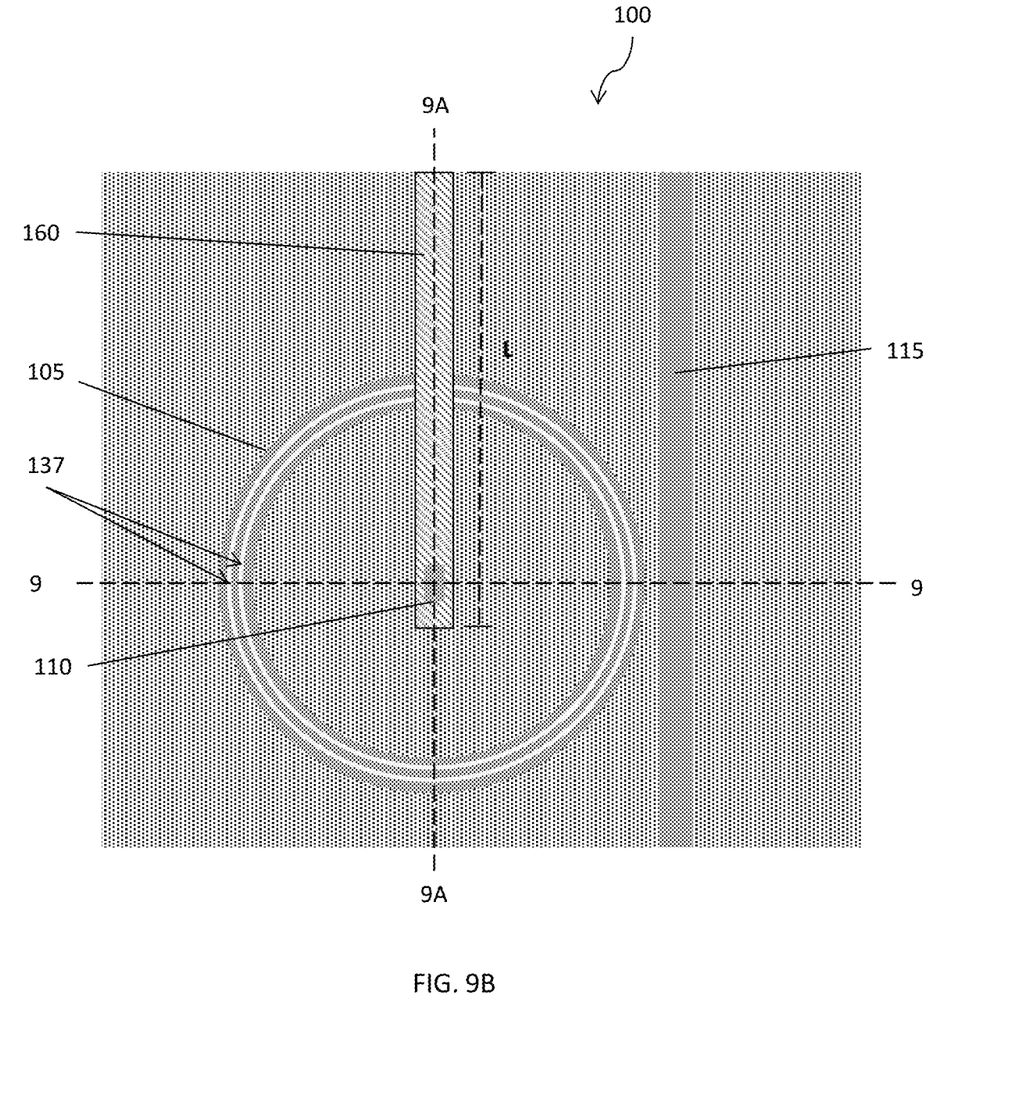

With reference to FIGS. 9, 9A, and 9B in which like reference numerals refer to like features in FIG. 8 and at a subsequent fabrication stage of the processing method, semiconductor material layer 150 is etched to define laser strip 160. FIG. 9 depicts one cross section of structure 100 of FIG. 9B, as taken across ring waveguide 105 at an end of laser strip 160 contacting seed region 110, while FIG. 9A depicts a cross-section of structure 100 of FIG. 9B taken along a length of laser strip 160. (The trench isolation regions 135, 137, as well as hard mask strip 161, are not depicted in FIG. 9B so as not to obstruct view of other components of structure 100.) Laser strip 160 may be formed, for example, by depositing a hard mask strip 161 over a portion of semiconductor material layer 150, leaving the remaining portion of semiconductor material layer 150 exposed, followed by an etch process to remove the exposed portion of semiconductor material layer 150. A hard mask strip 161 may be, in one instance, a nitride-based dielectric material (e.g., silicon nitride). The etching defines the laser strip 160, which extends over a portion of ring waveguide 105, with one end of laser strip 160 contacting seed region 110 and another end opposite the end contacting the seed region 110. The laser strip 160 may extend radially from the seed region 110 and transversely across the ring waveguide 105 in a different plane than the ring waveguide 105. The laser strip 160 is separated from the ring waveguide 105 by the dielectric layer 140. Hard mask strip 161 may remain in place over laser strip 160 to protect laser strip 160 during further processing stages, as described below, and may be removed at a later processing stage.

Figure 10:
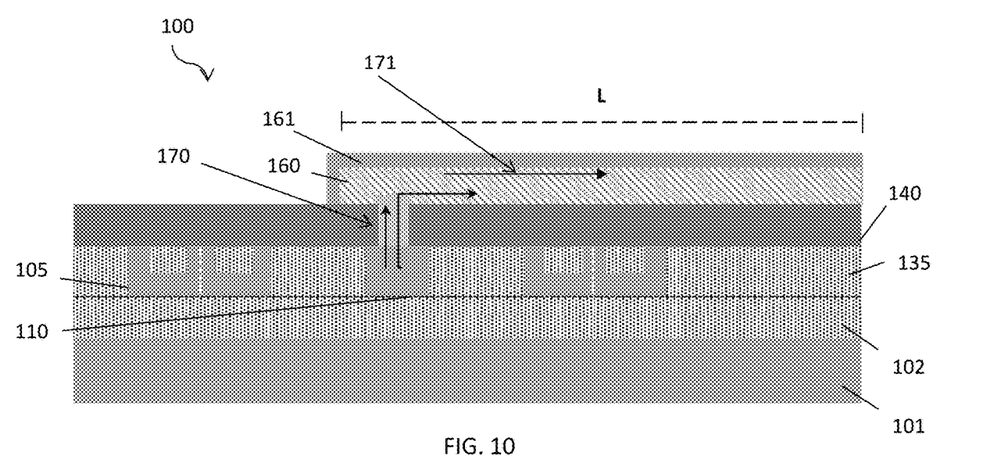
FIGS. 10-13 are cross-sectional views at successive processing stages subsequent to FIG. 9A.

With reference to FIG. 10 in which like reference numerals refer to like features in FIG. 9A and at a subsequent fabrication stage of the processing method, seed region 110 and laser strip 160 undergo thermal treatment, such as by a rapid thermal annealing process. The thermal treatment is performed to reach a pre-selected maximum temperature that causes the laser strip 160 to melt and enter a liquid state without also melting seed region 110 or ring waveguide 105. For example, silicon has a melting point of 1414° C., while gallium arsenide antimonide may melt at about 1062° C., so that the thermal treatment may be performed at or above about 1062° C. up to a temperature less than 1414° C. Hard mask strip 161, as well as patterned dielectric layer 140, may also have a melting point higher than the semiconductor material of laser strip 160 so that the liquefied semiconductor material of laser strip 160 remains confined below hard mask strip 161. Thermally treating seed region 110 permits diffusion of atoms 170 of the semiconductor material from seed region 110 into laser strip 160 while the semiconductor material of laser strip 160 is in a liquid state or at least partially in a liquid state.

The semiconductor material of the laser strip 160 also recrystallizes as the molten laser strip 160 cools and solidifies following the conclusion of the thermal treatment. In exemplary embodiments in which the semiconductor material of the laser strip 160 is a III-V material such as gallium arsenide antimonide, the thermal treatment and recrystallization processes may alter the relative composition of the III-V semiconductor material along the length L of the laser strip 160 such that the composition is graded along its length. Recrystallization of the semiconductor material of laser strip 160 may initiate at the end of laser strip 160 near seed region 110 as the semiconductor material of seed region 110 may promote recrystallization at an interface between seed region 110 and the semiconductor material of laser strip 160. Recrystallization then may progressively extend outward from seed region 110 along the laser strip 160 toward the end of laser strip 160 opposite the seed region 110. As recrystallization proceeds along length L of the laser strip 160, atoms of antimony 171 may be "ejected" and pushed in the molten material toward the end of laser strip 160 opposite the seed region 110. This phenomenon enriches the molten material in antimony. As cooling of the laser strip 160 proceeds following thermal treatment, the gallium arsenide antimonide at the end of laser strip 160 near or contacting seed region 110 will have a higher concentration of arsenic while the gallium arsenide antimonide at the opposing end of laser strip 160 will have a higher concentration of antimony. Thus, following thermal treatment and cooling, laser strip 160 may have a variable ratio of arsenic to antimony in the gallium arsenide antimonide alloy, where the ratio of arsenic to antimony is higher near the end of laser strip 160 contacting seed region 110 and lower (e.g., about 0) near the opposing end of laser strip 160. The variable ratio of arsenic to antimony at any particular location in laser strip 160 may depend, in part, on a selected temperature of the thermal treatment. In general, at a higher thermal treatment temperature, a higher concentration of arsenic compared to antimony will recrystallize at the seed region 110.

As the laser strip 160 subsequently cools, lower concentrations of arsenic and higher concentrations of antimony will recrystallize along the length of the laser strip 160 until, at the end of the laser strip opposite seed region 110, the recrystallized material will be pure gallium antimonide. Furthest from the seed region 110, the last portion of the laser strip 160 to recrystallize will be pure GaSb. For example, for a laser strip 160 having an initial ratio of arsenic to antimony of one-to-one, corresponding to a composition of $GaAs_xSb_{1-x}$ where x=0.5 initially, thermal treatment conducted at about 1100° C. may result in an x value of about 0.6 near the end of laser strip 160 contacting seed region 110, so that at this location the gallium arsenide antimonide of laser strip 160 contains about 60% arsenic and about 40% antimony. In another example, thermal treatment of a similar laser strip 160 at about 1200° C. may result in an x value for $GaAs_xSb_{1-x}$ of about 0.8 near the end of laser strip 160 contacting seed region 110, corresponding to gallium arsenide antimonide containing about 80% arsenic and 20% antimony.

Relative concentrations of arsenic and antimony in the gallium arsenide antimonide of laser strip 160 at a location extending over ring waveguide 105 and junction 106 may similarly depend on a selected thermal treatment temperature. Thus, thermal treatment of laser strip 160 may be controlled through the selection of a maximum temperature for the molten material to produce selected relative concentrations of arsenic and antimony at a position or location in laser strip 160 over ring waveguide 105.

Figure 11:
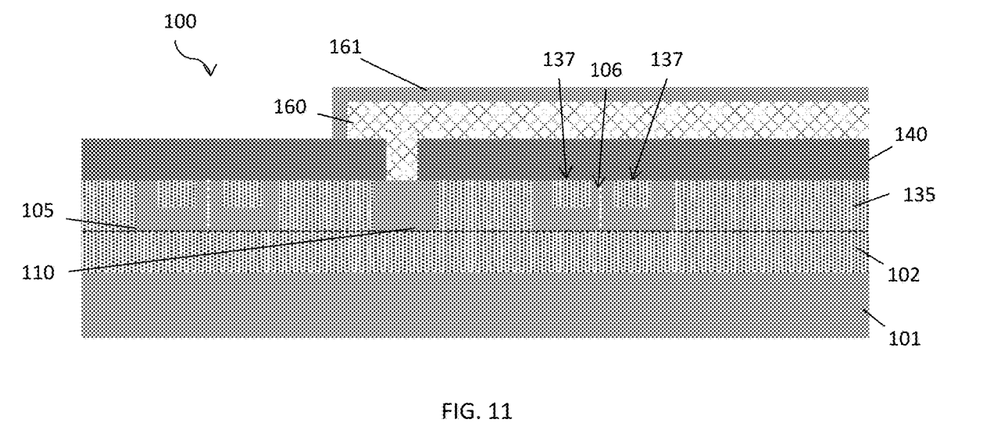

With reference to FIG. 11 in which like reference numerals refer to like features in FIG. 10 and at a subsequent fabrication stage of the processing method, laser strip 160 of structure 100 is depicted following the thermal treatment of FIG. 10 and after laser strip 160 has cooled to a recrystallized state, as described above. The recrystallized laser strip 160 may be partially or completely doped along its length with atoms of semiconductor material, such as silicon atoms, diffused from seed region 110 as a dopant.

Figure 12:
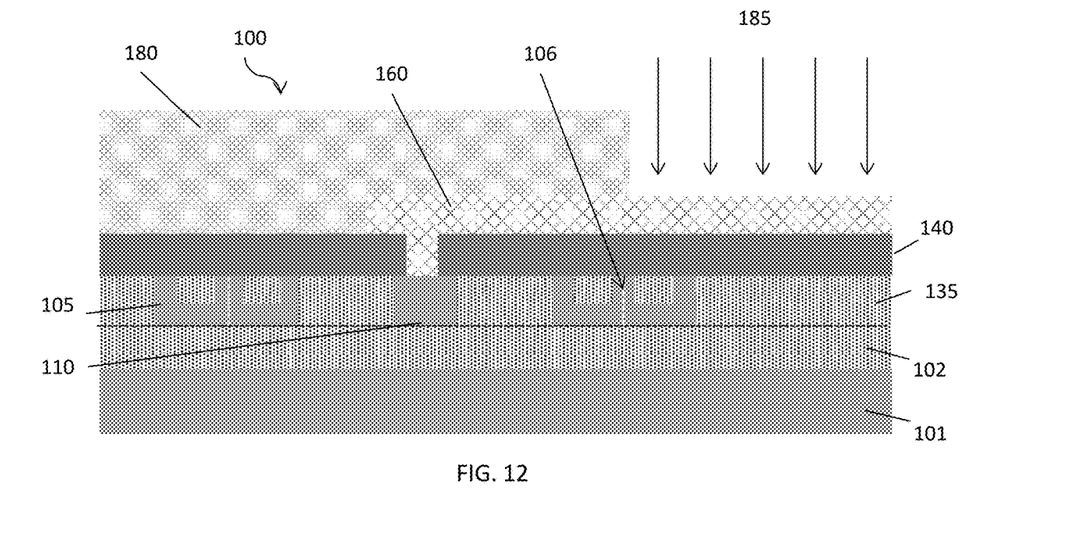

With reference to FIG. 12 in which like reference numerals refer to like features in FIG. 11 and at a subsequent fabrication stage of the processing method, a portion of laser strip 160 is masked by deposition of a masking material 180 and a dopant 185 is implanted in another portion of laser strip 160 left exposed by masking material 180. The dopant 185 implanted in the exposed portion of laser strip 160 has a polarity type opposite a polarity type of the dopant 170 diffused from seed region 110 during thermal treatment. For example, dopant 185 may be a p-type dopant if laser strip 160 has been doped with an n-type dopant, such as silicon atoms in gallium arsenide antimonide, during thermal treatment as described above. Dopant 185 may be implanted in an amount sufficient to effectively "counter-dope" the exposed portion of laser strip 160, if the exposed portion of laser strip 160 contains dopant of the opposing polarity type as described above. Implantation of a p-type dopant 185 in a portion of laser strip 160 results, as described below and illustrated in FIG. 13, in laser strip 160 having a p-type region 162b adjacent an n-type region 162a, and a p-n junction 163 between the two regions. Masking material 180 may be aligned with a portion of ring waveguide 105 so that a resulting p-n junction 163 is formed in laser strip 160 at a pre-selected location in laser strip 160 that is aligned with the p-n junction 106 of ring waveguide 105. Hard mask strip 161 may be removed to facilitate implanting of dopant 185, or, in alternative embodiments, may be left in place if the implanting of dopant 185 is conducted at an energy sufficient to allow ions of dopant 185 to pass through hard mask strip 161.

Figure 13:
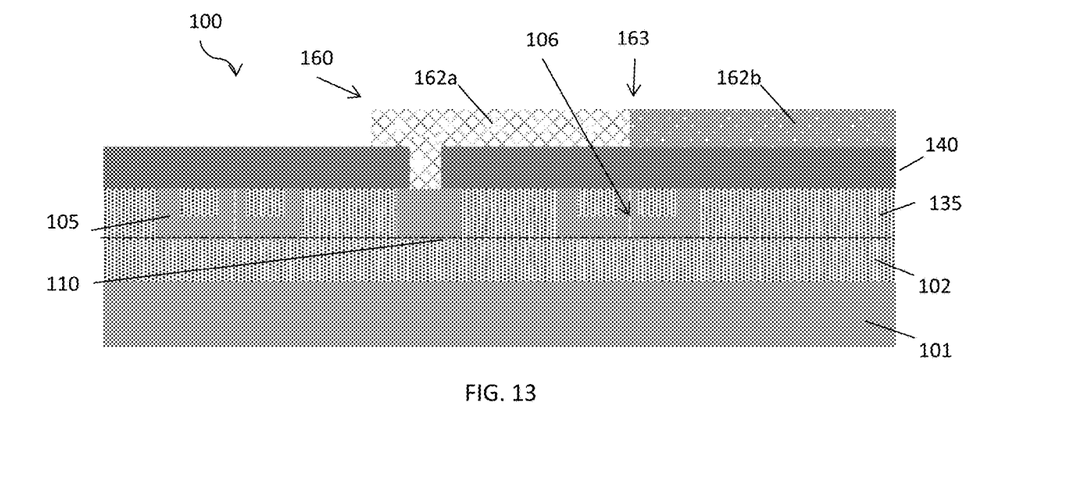

With reference to FIG. 13 in which like reference numerals refer to like features in FIG. 12 and at a subsequent fabrication stage of the processing method, structure 100 is shown fully formed as a laser generating structure 100, where laser strip 160 has a p-n junction 163 formed between an n-type region 162a and a p-type region 162b contacting n-type region 162a, and the p-n junction 163 of the laser strip 160 is aligned with the p-n junction 106 of ring waveguide 105. In the example embodiment of structure 100 depicted in FIG. 12, the p-n junction 163 of laser strip 160 is aligned directly with the p-n junction 106 of ring waveguide 105. In other embodiments the p-n junction 163 of laser strip 160 need not be directly aligned with p-n junction 106 in the ring waveguide 105, but the two junctions may nevertheless be aligned sufficiently close together so that p-n junction 163 and p-n junction 106 are adiabatically coupled with one another to permit transfer of electromagnetic radiation from p-n junction 163 into ring waveguide 105. Generally, the more separation between p-n junction 163 and p-n junction 106, the less effective the transfer of laser light from one junction to the other junction will be.

With further reference to FIG. 13, for a laser strip 160 made of gallium arsenide antimonide, the location of p-n junction 163 in laser strip 160 determines, at least partially, a wavelength of electromagnetic radiation that may be generated by laser strip 160, as the ratio of arsenic to antimony at p-n junction 160 affects the wavelength of electromagnetic radiation generated. The wavelength of light that may be produced by a semiconductor material such as gallium arsenide antimonide is determined by the band gap energy level of the semiconductor material, with a higher bandgap energy producing lower wavelengths of laser light. The bandgap of gallium arsenide antimonide decreases with increasing antimony content, so that in a laser strip 160 of gallium arsenide antimonide that has a decreasing ratio of arsenic to antimony along the length L of the laser strip 160, the bandgap energy level of the laser strip also decreases along length L. Thus, p-n junction 163 may be formed at a pre-selected location along length L of the laser strip 160 where the ratio of arsenic to antimony at that location may produce a desired wavelength of electromagnetic radiation. By controlling both thermal treatment of laser strip 160 as described above, as well as controlling the location of the formation of p-n junction 163 in laser strip 160, the wavelength of laser light that can be produced by laser strip 160 may be selected during fabrication of structure 100.

In an embodiment, the structure 100 may be integrated into a photonics chip characterized by monolithically integrated optics and electronics.

Figure 14:
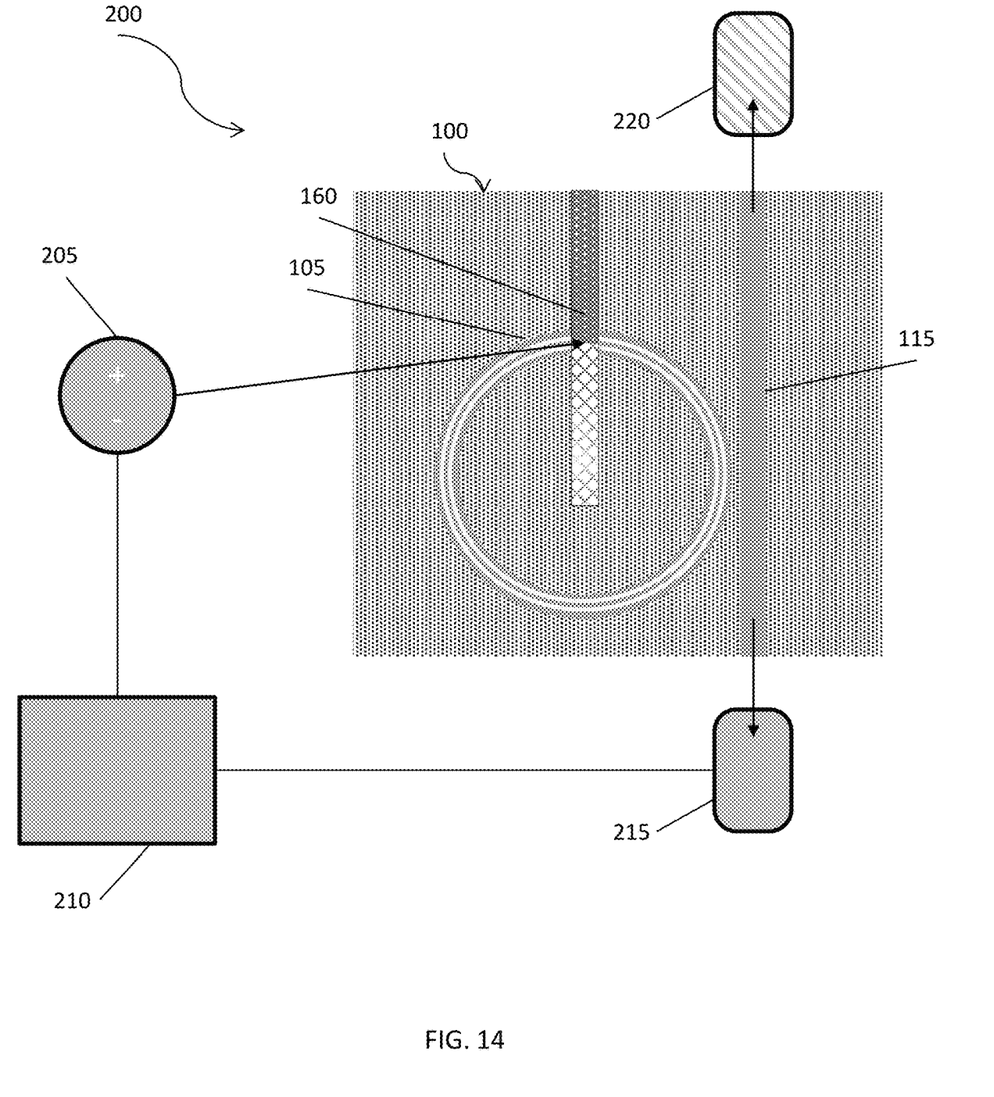
FIGS. 14 and 15 are schematic diagrams of systems including a laser generating structure in accordance with embodiments of the invention.

With reference to FIG. 14 in which like reference numerals refer to like features in FIGS. 1-13, an embodiment of a system 200 is depicted that includes laser generating structure 100, a voltage source 205, and a controller 210 operatively coupled to the voltage source 205. Laser generating structure 100 may include, as described above, a laser strip 160, a ring waveguide 105, and passing waveguide 115. Controller 210 may be operatively coupled to ring waveguide 105 and may also be operatively coupled to the laser strip 160, for example via voltage source 205 being operatively coupled with ring waveguide 105 so that voltage source 205 may apply an electrical bias to ring waveguide 105. Controller 210 is capable of controlling voltage source 205 to modify a bias applied to ring waveguide 105 to determine, at least in part, power of a laser produced by laser generating structure 100 that is output to passing waveguide 115. As described above, a wavelength of laser light produced by laser strip 160 may be determined in part by the composition of materials of laser strip at a p-n junction 163 formed in the laser strip, for example, the ratio of arsenic to antimony in recrystallized gallium arsenide antimonide at the p-n junction 163 of laser strip 160.

The laser light produced by laser strip 160 may then be passed to ring waveguide 105 at a p-n junction 106 within ring waveguide 105. An electrical bias applied by voltage source 205 to p-n junction 106 of ring waveguide 105 may be tuned to allow laser light generated in laser strip 160 to be transferred into ring waveguide 105 at p-n junction 106, or the electrical bias may be tuned to block transfer of laser light from laser strip 160, as desired. As the transferred laser light reflects and circulates within ring waveguide 105, with constraint provided by the shallow trench isolation 137, an electrical bias applied by voltage source 205 to the p-n junction 106 in ring waveguide 105 may further drive the laser light as it circulates to modify the intensity of the laser light. Controller 210 is capable of controlling voltage source 205 to control and modify, as needed, the bias applied to ring waveguide 105 to produce a desired amplification of laser light that may then be output to passing waveguide 115.

Passing waveguide 115 may be adiabatically coupled with ring waveguide 105, such that a portion of passing waveguide 115 is in close proximity to a portion of ring waveguide 105 so that laser light from ring waveguide 105 can be output to passing waveguide 115 with little or no energy loss, and the laser light may then be transmitted through passing waveguide 115. Passing waveguide 115 may be coupled to another device 220 to which the laser light is transmitted. Device 220 may be any device capable of receiving laser light, such as a photodetector, a modulator, another laser generating structure, and so on.

With further reference to FIG. 14, system 200 may also include a photodetector 215 adiabatically coupled with the passing waveguide 115 and operatively coupled with the controller 210. Photodetector 215 may be included to provide feedback to controller 210. The feedback may include information that may be passed to controller 210 to facilitate control of voltage source 205, such as the energy of laser light being output to passing waveguide 115 from ring waveguide 105. The feedback provided to controller 210 may facilitate controlling the bias applied by voltage source 205 to prevent overdriving of the laser generated by laser generating structure 100. Generally, ring waveguides such as ring waveguide 105 circulate and reflect laser light both in clockwise and counter-clockwise directions along the ring waveguide, so that laser light output to passing waveguide 115 will be transmitted in both directions along passing waveguide 115. This permits one end of passing waveguide 115 to be coupled with photodetector 215 for control of voltage source 205 while another end of passing waveguide transmits laser light to other devices 220.

In an embodiment, all or part of the system 200 may comprise a photonics chip characterized by monolithically integrated optics and electronics, including the integrated laser generating structure 100.

Figure 15:
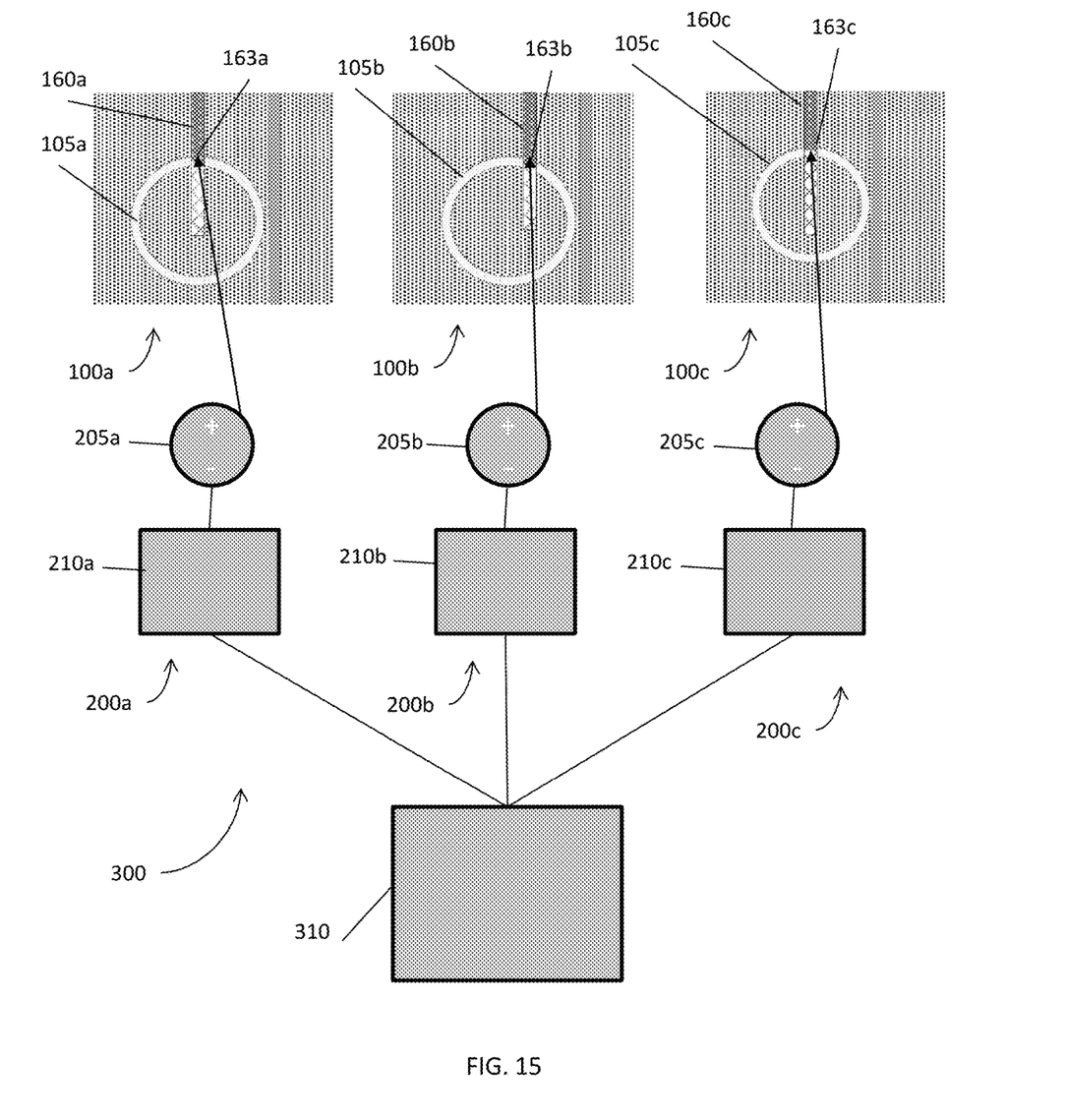
Figure 16:
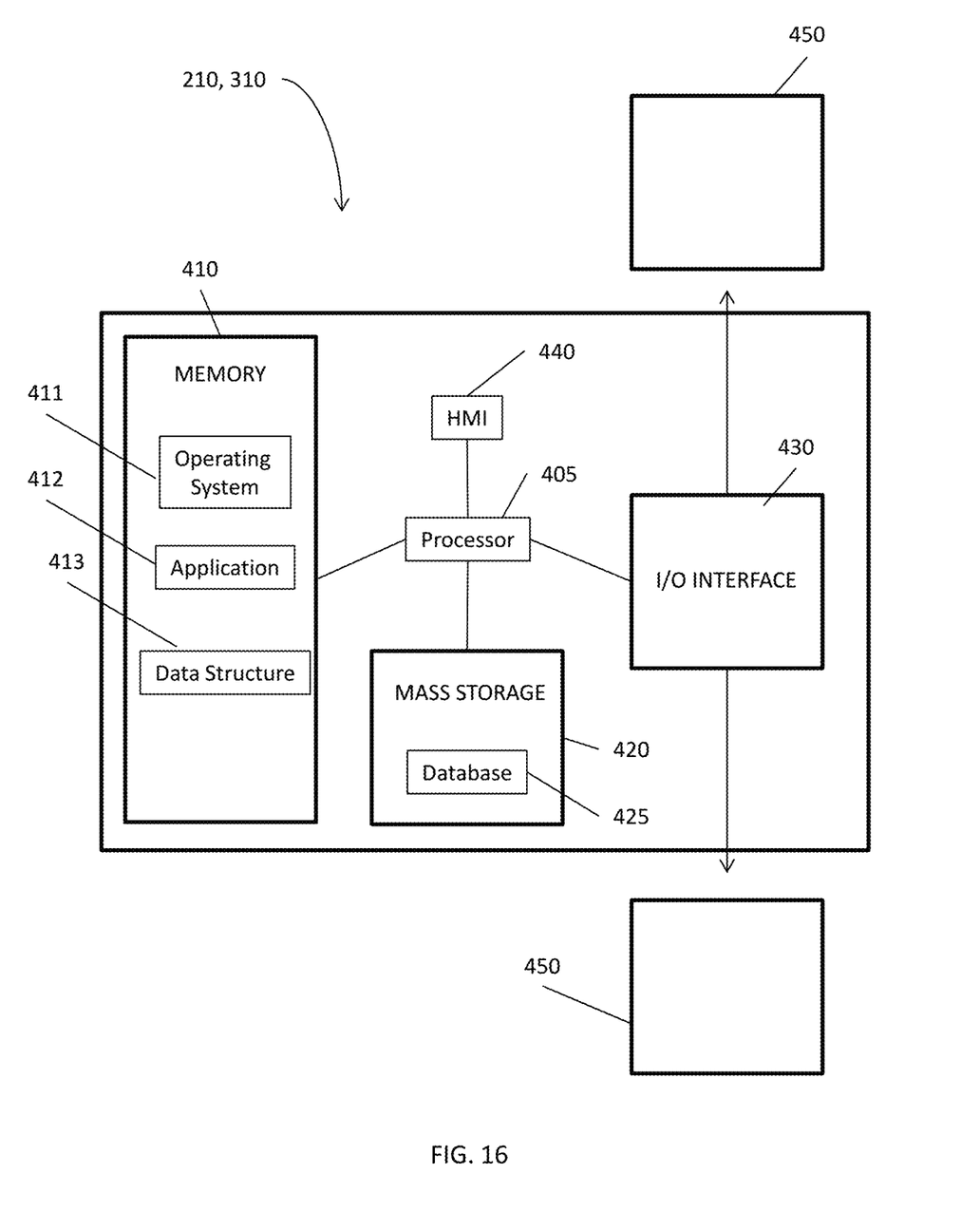
FIG. 16 is a schematic diagram of a controller in accordance with embodiments of the invention.

With reference to FIG. 15 in which like reference numerals refer to like features in FIGS. 1-14, an embodiment of a system 300 is depicted that includes a master controller 310 operatively coupled to multiple systems 200a, 200b, 200c similar to the embodiment of system 200 depicted by FIG. 13. Master controller 310 may be a similar controller to a controller 210 as described above and as further detailed below, and may be coupled with multiple controllers 210a, 210b, 210c of systems 200a, 200b, 200c. Each of systems 200a, 200b, 200c includes a laser generating structure 100a, 100b, 100c, but each laser generating structure is capable of producing different wavelengths of light from each other due to, at least in part, the location of a p-n junction 163a, 163b, 163c in each laser generating structure. Laser generating structure 100a, for example, is similar to laser generating structure 100 of system 200 as depicted in FIG. 13. Laser generating structure 100b, on the other hand, has a laser strip 160b formed slightly off-center from a center of corresponding ring waveguide 105b, affecting the placement of p-n junction 163b within laser strip 160b relative to ring waveguide 105b, as compared to the placement of p-n junction 163a within laser strip 160a. As a result, laser strip 160b may produce a different wavelength of laser light than the wavelength produced by laser strip 160a. Similarly, laser strip 160c is formed slightly off center from ring waveguide 105c in a different direction, so that the location of p-n junction 163c is placed further along a length of laser strip 160c (e.g., in a region of a lower arsenic to antimony ratio) as compared to either laser strip 160b or laser strip 160a, so that laser strip 160c produces yet another different laser wavelength. Master controller 310 may facilitate control of any or all of controllers 210a, 210b, 210c to control electrical biases applied to laser generating structures 100a, 100b, 100c. Thus, multiple laser generating structures may be formed on a single device structure and controlled by a single master controller 310 with each laser generating structure producing different wavelengths of light.

In an embodiment, all or part of the systems 200*a*, 200*b*, 200*c* may comprise a photonics chip characterized by monolithically integrated optics and electronics, including the integrated laser generating structures 100*a*, 100*b*, 100*c*.

With reference to FIG. 15 in which like reference numerals refer to like features in FIGS. 13-14, a schematic of a controller 210, 310 is depicted. The controller 210, 310 may include a processor 405, a memory 410, a mass storage memory device 420, an input/output (I/O) interface 430, and a Human Machine Interface (HMI) 440. The controller 210, 310 may also be operatively coupled to one or more external resources 450 via I/O interface 430, such as a voltage source 205 as described above or another controller 210, 310 as described above, or other device.

The processor 405 may include one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in the memory 410. The memory 410 may include a single memory device or a plurality of memory devices including, but not limited to, read-only memory (ROM), random access memory (RAM), volatile memory, non-volatile memory, static random access memory (SRAM), dynamic random access memory (DRAM), flash memory, cache memory, or any other device capable of storing information. The mass storage memory device 420 may include data storage devices such as a hard drive, optical drive, tape drive, non-volatile solid state device, or any other device capable of storing information.

The processor 405 may operate under the control of an operating system 411 that resides in the memory 410. The operating system 411 may manage computer resources so that computer program code embodied as one or more computer software applications, such as an application 412 residing in memory 410, may have instructions executed by the processor 405. In an alternative embodiment, the processor 405 may execute the application 412 directly, in which case the operating system 411 may be omitted. One or more data structures 413 may also reside in memory 410, and may be used by the processor 405, operating system 411, or application 412 to store or manipulate data.

The I/O interface 430 may provide a machine interface that operatively couples the processor 405 to other devices and systems, such as the one or more external resources 450. The application 412 may thereby work cooperatively with the external resources 450 by communicating via the I/O interface 430 to provide the various features, functions, applications, processes, or modules comprising embodiments of the invention. The application 412 may also have program code that is executed by the one or more external resources 450, or otherwise rely on functions or signals provided by other system or network components external to the controller 210, 310. Indeed, given the nearly endless hardware and software configurations possible, persons having ordinary skill in the art will understand that embodiments of the invention may include applications that are located externally to the controller 210, 310, distributed among multiple computers or other external resources 450, or provided by computing resources (hardware and software) that are provided as a service over a network (not depicted in FIG. 15).

The HMI 440 may be operatively coupled to the processor 405 of controller 210, 310 in a known manner to allow a user to interact directly with the controller 210, 310. The HMI 440 may include video or alphanumeric displays, a touch screen, a speaker, and any other suitable audio and visual indicators capable of providing data to the user. The HMI 440 may also include input devices and controls such as an alphanumeric keyboard, a pointing device, keypads, push-buttons, control knobs, microphones, etc., capable of accepting commands or input from the user and transmitting the entered input to the processor 405.

A database 425 may reside on the mass storage memory device 420, and may be used to collect and organize data used by the various systems and modules described herein. The database 425 may include data and supporting data structures that store and organize the data. In particular, the database 425 may be arranged with any database organization or structure including, but not limited to, a relational database, a hierarchical database, a network database, or combinations thereof. A database management system in the form of a computer software application executing as instructions on the processor 405 may be used to access the information or data stored in records of the database 425 in response to a query, where a query may be dynamically determined and executed by the operating system 411, other applications 412, or one or more modules.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a ring waveguide;
    a seed region arranged interior of the ring waveguide, the seed region having a crystal structure; and
    a laser strip extending across a portion of the ring waveguide, the laser strip having a first end contacting the seed region and a second end opposite the first end, the laser strip comprised of a laser medium, and the laser strip including a first p-n junction,
    wherein the laser strip is capable of generating electromagnetic radiation, and the first p-n junction is aligned with the portion of the ring waveguide, the ring waveguide includes a second p-n junction disposed at least partially in the portion of the ring waveguide, and the first p-n junction is operatively coupled with the second p-n junction.

2. The structure of claim 1 wherein the laser medium is a III-V semiconductor material.

3. The structure of claim 2 wherein the III-V semiconductor material is gallium arsenide antimonide.

4. The structure of claim 3 wherein the laser strip has a length from the first end to the second end, and the gallium arsenide antimonide has a ratio of arsenic to antimony that decreases along the length from the first end of the laser strip to the second end of the laser strip.

5. The structure of claim 4 wherein the ratio of arsenic to antimony at the first p-n junction at least partially determines a wavelength of electromagnetic radiation generated by the laser strip.

6. The structure of claim 1 wherein the first p-n junction is disposed between an n-type region in the laser medium and a p-type region in the laser medium, the n-type region includes silicon as an n-type dopant in the laser medium, and the p-type region includes a p-type dopant in the laser medium.

7. The structure of claim 1 wherein the seed region is a portion of a substrate, and the structure is an element of a photonics chip formed using the substrate.

8. The structure of claim 1 wherein the laser strip is rectangular.

9. A structure comprising:
    a ring waveguide;
    a seed region arranged interior of the ring waveguide; and
    a laser strip extending across a portion of the ring waveguide, the laser strip having a first end contacting the seed region and a second end opposite the first end, the laser strip comprised of gallium arsenide antimonide, and the laser strip including a first p-n junction,
    wherein the laser strip is capable of generating electromagnetic radiation, the first p-n junction is aligned with the portion of the ring waveguide, the laser strip has a length from the first end to the second end, and the gallium arsenide antimonide has a ratio of arsenic to antimony that decreases along the length from the first end of the laser strip to the second end of the laser strip.

10. The structure of claim 9 wherein the ratio of arsenic to antimony at the first p-n junction at least partially determines a wavelength of electromagnetic radiation generated by the first p-n junction.

11. The structure of claim 9 wherein the ring waveguide includes a second p-n junction disposed at least partially in the portion of the ring waveguide, and the first p-n junction is operatively coupled with the second p-n junction.

12. The structure of claim 9 wherein the first p-n junction is disposed between an n-type region in the gallium arsenide antimonide and a p-type region in the gallium arsenide antimonide, the n-type region includes silicon as an n-type dopant in the gallium arsenide antimonide, and the p-type region includes a p-type dopant in the gallium arsenide antimonide.

13. A system comprising:
    a laser generating structure including a ring waveguide, a passing waveguide adjacent to the ring waveguide, and a laser strip extending across a portion of the ring waveguide, the laser strip having a length from a first end of the laser strip to a second end of the laser strip, the laser strip comprised of gallium arsenide antimonide, and the gallium arsenide antimonide having a ratio of arsenic to antimony that decreases along the length from the first end of the laser strip to the second end of the laser strip;
    a voltage source; and
    a controller operatively coupled to the voltage source and the ring waveguide, the controller configured to control the voltage source to modify a bias applied to the ring waveguide such that a power of a laser generated by the laser generating structure is determined.

14. The system of claim 13 further comprising:
    a photodetector adiabatically coupled with the passing waveguide,
    wherein the photodetector is operatively coupled with the controller, and the photodetector provides feedback to the controller for controlling the voltage source.

15. The system of claim 13 wherein the laser strip includes a first p-n junction disposed within the laser strip, and the ratio of arsenic to antimony at the first p-n junction at least partially determines a wavelength of the laser generated by the laser generating structure.

16. The system of claim 15 wherein the ring waveguide includes a second p-n junction disposed at least partially in the portion of the ring waveguide, and the first p-n junction is operatively coupled with the second p-n junction.

17. The system of claim 13 wherein the laser generating structure includes a seed region arranged interior of the ring waveguide, the seed region has a crystal structure, and the first end of the laser contacts the seed region.

* * * * *